(12) United States Patent
Nakamura et al.

(10) Patent No.: US 8,013,329 B2
(45) Date of Patent: Sep. 6, 2011

(54) ORGANIC FIELD EFFECT TRANSISTOR

(75) Inventors: Yoshiko Nakamura, Higashimurayama (JP); Masato Ueda, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 163 days.

(21) Appl. No.: 12/532,382

(22) PCT Filed: Mar. 6, 2008

(86) PCT No.: PCT/JP2008/054070
§ 371 (c)(1),
(2), (4) Date: Oct. 13, 2009

(87) PCT Pub. No.: WO2008/117647
PCT Pub. Date: Oct. 2, 2008

(65) Prior Publication Data
US 2010/0051921 A1 Mar. 4, 2010

(30) Foreign Application Priority Data
Mar. 23, 2007 (JP) ................ P2007-077516

(51) Int. Cl.
 *H01L 35/24* (2006.01)
 *H01L 51/00* (2006.01)
(52) U.S. Cl. .......... 257/40; 257/59; 257/E29.117; 257/E51.027
(58) Field of Classification Search .......... 257/40, 257/59, 72, E29.117, E29.273, E51.027
See application file for complete search history.

(56) References Cited

U.S. PATENT DOCUMENTS

| | | | |
|---|---|---|---|
| 6,353,083 | B1 | 3/2002 | Inbasekaran et al. |
| 2003/0059987 | A1 | 3/2003 | Sirringhaus et al. |
| 2003/0067267 | A1 | 4/2003 | Heeney et al. |
| 2004/0108562 | A1 | 6/2004 | Nagayama et al. |
| 2006/0270066 | A1 | 11/2006 | Imahayashi et al. |
| 2010/0178727 | A1* | 7/2010 | Hirai et al. ........... 438/99 |

FOREIGN PATENT DOCUMENTS

| | | |
|---|---|---|
| JP | 2003-518332 A | 6/2003 |
| JP | 2003-192770 A | 7/2003 |
| JP | 2004-103905 A | 4/2004 |
| JP | 2005-260192 A | 9/2005 |
| JP | 2007-019291 A | 1/2007 |

OTHER PUBLICATIONS

Zhenan Bao, et al., "Soluble and processable regioregular poly (3-hexylthiophene) for thin film field-effect transistor applications with high mobility", Appl. Phys. Lett. Dec. 1996, pp. 4108-4110, vol. 69, No. 26.

Riadh Hajlaoui, et al., "Improved Field-Effect Mobility in Short Oligothiophenes: Quaterthiophene and Quinquethiophene", Communications, Adv.Mater., 1997, vol. 9, No. 5.

* cited by examiner

*Primary Examiner* — Hoai V Pham
(74) *Attorney, Agent, or Firm* — Sughrue Mion, PLLC

(57) ABSTRACT

An organic field effect transistor comprising a gate electrode 2, a gate insulating layer 3, a semiconductor layer 4, a source electrode 7, and a drain electrode 8, wherein the source electrode 7 and the drain electrode 8 are composed of conductive layers 6 and 6', and compound layers 5 and 5' comprising an acceptor compound, respectively, wherein the compound layers 5 and 5' are each located in contact with the semiconductor layer 4, and wherein the semiconductor layer 4 contains a polymer compound having an ionization potential of 5.0 eV or more.

4 Claims, 4 Drawing Sheets

ORGANIC FIELD EFFECT TRANSISTOR

TECHNICAL FIELD

The present invention relates to an organic field effect transistor containing a polymer compound.

BACKGROUND ART

A field effect transistor, one type of transistor, is expected to be applied to the pixel-driving switching element of an active matrix liquid crystal display and an organic electroluminescent display, and the like.

This field effect transistor has a structure in which a gate electrode is formed, via a gate insulating layer, on a semiconductor layer sandwiched between a source electrode and a drain electrode. While various semiconductor materials can be used for the semiconductor layer, in recent years, an organic field effect transistor using a polymer compound as the semiconductor material has gained attention. For example, Non-Patent Document 1 discloses an organic field effect transistor using poly-3-hexylthiophene (P3HT) for the semiconductor layer.

Non-Patent Document 1: Z. Bao et al., Applied Physics Letters Vol. 69, p. 4108 (1996)

DISCLOSURE OF THE INVENTION

When such an organic field effect transistor is applied to the above-described switching element, it is required that the current on/off ratio be high to improve the contrast of the display. In other words, it is required that current flowing between the source electrode and the drain electrode when the gate voltage is 0 V (off-state current) is small, and that current flowing between the source electrode and the drain electrode when voltage is applied to the gate electrode (on-state current) is large.

But, a problem of conventional organic field effect transistors using a polymer compound is that the current on/off ratio is not sufficient. Further, another problem of conventional organic field effect transistors is that the current on/off ratio decreases when they are exposed to the air.

Accordingly, it is an object of the present invention to provide an organic field effect transistor using a polymer compound, in which the on-state current and the current on/off ratio are sufficiently high, and in which the decrease in current on/off ratio is sufficiently small even when the organic field effect transistor is exposed to the air.

As a result of their diligent study, the present inventors have found that the above problems can be solved by an organic field effect transistor comprising a gate electrode, a gate insulating layer, a semiconductor layer, a source electrode, and a drain electrode, wherein the source electrode and the drain electrode are each composed of a conductive layer and a compound layer comprising an acceptor compound, wherein the compound layers are each located in contact with the semiconductor layer, and wherein the semiconductor layer contains a polymer compound having an ionization potential of 5.0 eV or more.

In the organic field effect transistor of the present invention, the on-state current and the current on/off ratio are sufficiently high, and the decrease in current on/off ratio is sufficiently small even when the organic field effect transistor is exposed to the air. The reasons for such effects are not necessarily clear, but it is considered that such effects are at least caused by the facts that the semiconductor layer contains a polymer compound having an ionization potential of 5.0 eV or more, and that the compound layer is formed between the conductive layer and the semiconductor layer. The "acceptor compound" indicates a compound exhibiting electron accepting properties with respect to the above polymer compound.

The polymer compound preferably has a fluorene skeleton. According to this, the decrease in current on/off ratio in the air, in such an organic field effect transistor, is further reduced. The "polymer compound having a fluorene skeleton" refers to a polymer compound having one or more fluorene skeletons represented by the following formula (1), in the molecule.

[Formula 1]

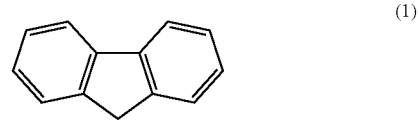

(1)

The above acceptor compound is preferably tetracyanoquinodimethane (TCNQ) and/or tetracyanotetrafluoroquinodimethane ($F_4$TCNQ). According to this, the on-state current and the current on/off ratio in such an organic field effect transistor are further improved. The reasons are not necessarily clear, but it is considered that, for example, one cause is that since the compound layer in the organic field effect transistor comprises the above-described acceptor compound, holes can be more efficiently injected from the drain electrode to the semiconductor layer.

The above acceptor compound is also preferably a fullerene derivative. According to this, the on-state current and the current on/off ratio in such an organic field effect transistor are further improved. The reasons are not necessarily clear, but it is considered that, for example, one cause is that since the compound layer in the organic field effect transistor comprises a fullerene derivative as the acceptor compound, the adhesion of the compound layer to the conductive layer and semiconductor layer is improved, and the transfer of holes between these layers is easy.

The present invention can provide an organic field effect transistor in which the on-state current and the current on/off ratio are sufficiently high, and in which the decrease in current on/off ratio is sufficiently small even when the organic field effect transistor is exposed to the air. Such an organic field effect transistor is preferably used for the pixel-driving switching element of an active matrix liquid crystal display and organic electroluminescent display, and the like. Further, in the organic field effect transistor of the present invention, the decrease in current on/off ratio is sufficiently small even when the organic field effect transistor is exposed to the air, so, for example, the effect of oxygen in the air need not be eliminated or minimized in the process of manufacturing the organic field effect transistor, and therefore, the organic field effect transistor can be easily manufactured, compared with conventional ones.

DESCRIPTION OF SYMBOLS

Figure 1:
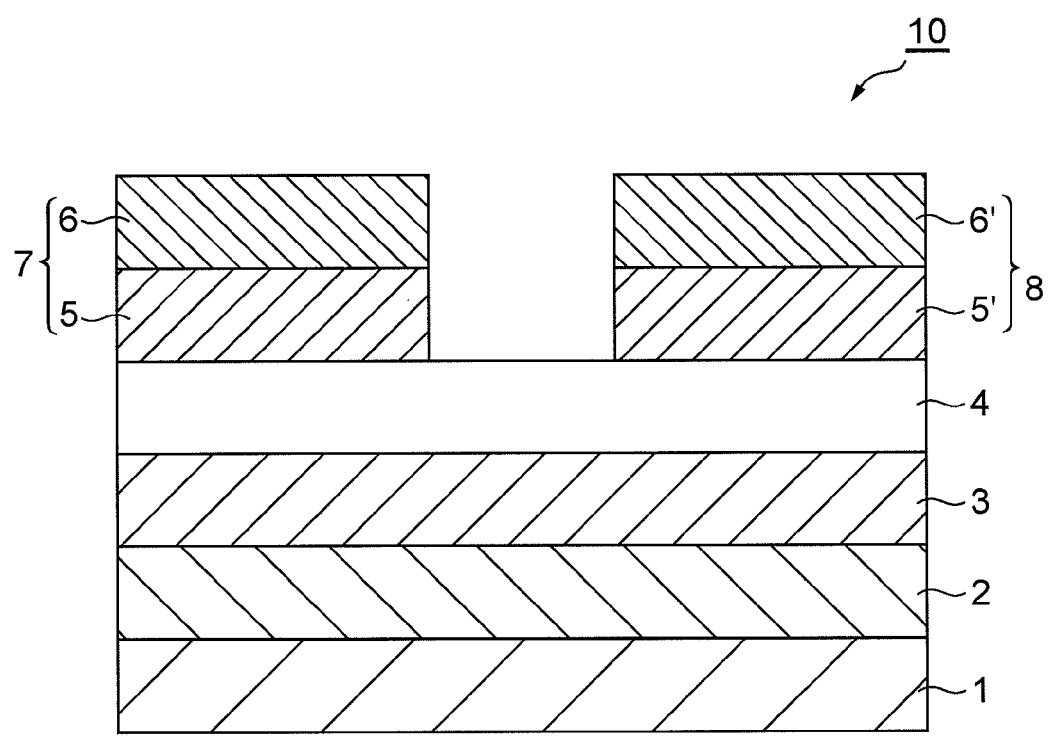
FIG. 1 is a schematic sectional view showing a first embodiment of the organic field effect transistor of the present invention.

1 . . . substrate, 2 . . . gate electrode, 3 . . . gate insulating layer, 4 . . . semiconductor layer, 5 and 5' . . . compound layers, 6 and 6' . . . conductive layers, 7 . . . source electrode, 8 . . . drain electrode, 10, 20, 30, and 40 . . . organic field effect transistors.

BEST MODE FOR CARRYING OUT THE INVENTION

The preferred embodiments of the present invention will be described below in detail, referring to the drawings in some cases, but the present invention is not limited to the following embodiments. The same numerals denote the same or equivalent elements, and a description of them is omitted when the description is redundant.

[Organic Field Effect Transistor]

The organic field effect transistor of the present invention comprises a gate electrode, a gate insulating layer, a semiconductor layer, a source electrode, and a drain electrode. Further, the source electrode and the drain electrode in the organic field effect transistor of the present invention are each composed of a conductive layer and a compound layer, and the compound layers are each located in contact with the semiconductor layer. FIG. 1 to FIG. 4 are each a schematic sectional view showing a preferred embodiment of such an organic field effect transistor. These figures will be described below.

FIG. 1 is a schematic sectional view showing a first embodiment of the organic field effect transistor of the present invention. An organic field effect transistor 10 shown in FIG. 1 has a structure in which a gate electrode 2, a gate insulating layer 3, and a semiconductor layer 4 are laminated in this order on a substrate 1, and in which a source electrode 7 and a drain electrode 8 are provided in parallel on the semiconductor layer 4. The source electrode 7 has a compound layer 5 and a conductive layer 6, and the drain electrode 8 has a compound layer 5' and a conductive layer 6'. The source electrode 7 and the drain electrode 8 are in contact with the semiconductor layer 4 on the compound layers 5 and 5' sides, respectively.

Figure 2:
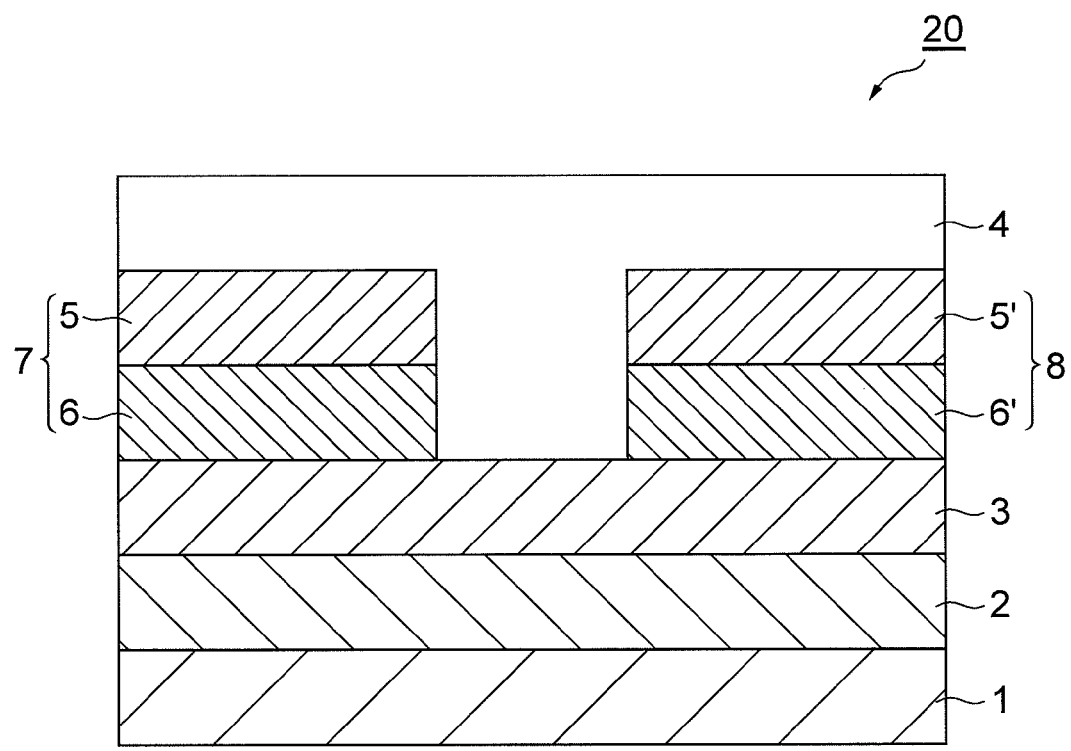
FIG. 2 is a schematic sectional view showing a second embodiment of the organic field effect transistor of the present invention.

FIG. 2 is a schematic sectional view showing a second embodiment of the organic field effect transistor of the present invention. An organic field effect transistor 20 shown in FIG. 2 has a structure in which a gate electrode 2 and a gate insulating layer 3 are laminated in this order on a substrate 1, in which a source electrode 7 and a drain electrode 8 are provided in parallel on the gate insulating layer 3, and in which a semiconductor layer 4 is provided covering the gate insulating layer 3, the source electrode 7, and the drain electrode 8. The source electrode 7 has a compound layer 5 and a conductive layer 6, and the drain electrode 8 has a compound layer 5' and a conductive layer 6'. The source electrode 7 and the drain electrode 8 are in contact with the gate insulating layer 3 on the conductive layers 6 and 6' sides, respectively.

Figure 3:
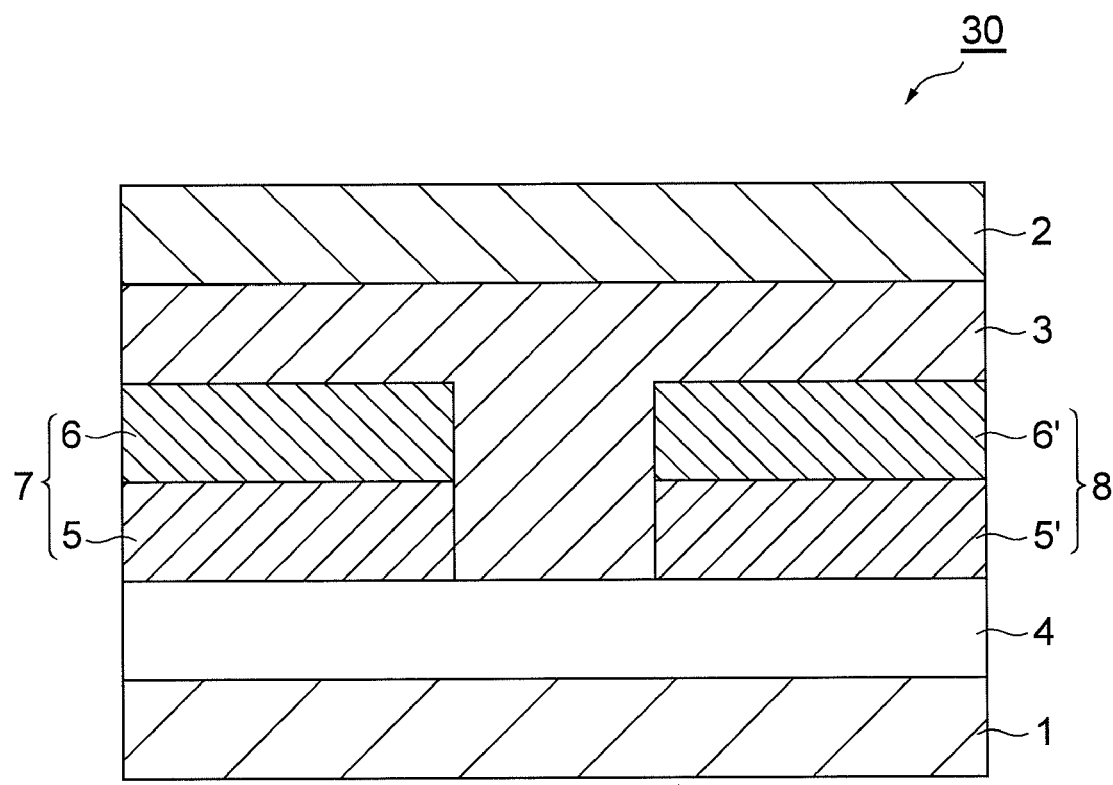
FIG. 3 is a schematic sectional view showing a third embodiment of the organic field effect transistor of the present invention.

FIG. 3 is a schematic sectional view showing the third embodiment of the organic field effect transistor of the present invention. An organic field effect transistor 30 shown in FIG. 3 has a structure in which a semiconductor layer 4 is laminated on a substrate 1, in which a source electrode 7 and a drain electrode 8 are provided in parallel on the semiconductor layer 4, in which a gate insulating layer 3 is provided covering the semiconductor layer 4, the source electrode 7, and the drain electrode 8, and in which a gate electrode 2 is further laminated on the gate insulating layer 3. The source electrode 7 has a compound layer 5 and a conductive layer 6, and the drain electrode 8 has a compound layer 5' and a conductive layer 6'. The source electrode 7 and the drain electrode 8 are in contact with the semiconductor layer 4 on the compound layers 5 and 5' sides, respectively.

Figure 4:
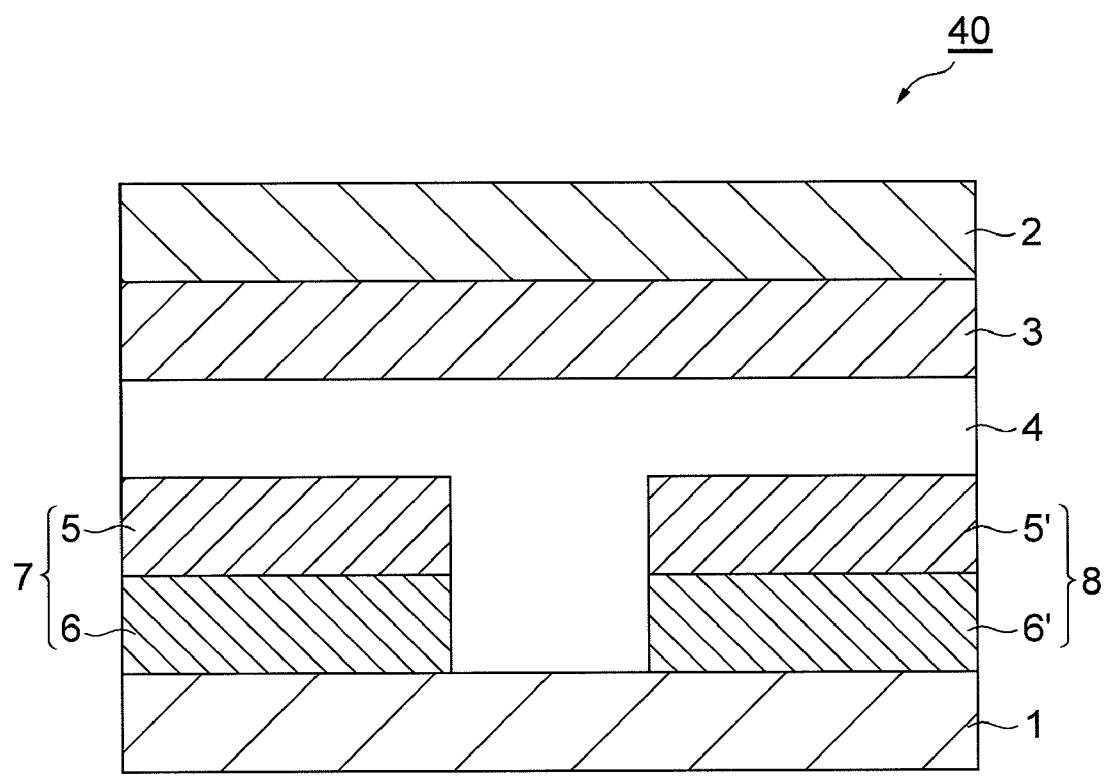
FIG. 4 is a schematic sectional view showing a fourth embodiment of the organic field effect transistor of the present invention.

FIG. 4 is a schematic sectional view showing the fourth embodiment of the organic field effect transistor of the present invention. An organic field effect transistor 40 shown in FIG. 4 has a structure in which a source electrode 7 and a drain electrode 8 are provided in parallel on a substrate 1, in which a semiconductor layer 4 is provided covering the substrate 1, the source electrode 7, and the drain electrode 8, and in which a gate insulating layer 3 and a gate electrode 2 are further laminated in this order on the semiconductor layer 4. The source electrode 7 has a compound layer 5 and a conductive layer 6, and the drain electrode 8 has a compound layer 5' and a conductive layer 6'. The source electrode 7 and the drain electrode 8 are in contact with the substrate 1 on the conductive layers 6 and 6' sides, respectively.

In the above embodiments, an electric field is applied from the gate electrode 2 to the semiconductor layer 4. This applied electric field controls current flowing between the source electrode 7 and the drain electrode 8, providing the function of the transistor. The preferred mode of each layer in the above-described embodiments will be described below.

(Substrate)

The substrate 1 needs only to be one that does not inhibit the characteristics of the organic field effect transistor, and, for example, a glass substrate, a flexible film substrate, a plastic substrate, and a silicon substrate can be used. The thickness of such substrate 1 is preferably 10 to 2000 μm.

(Gate Electrode)

As the gate electrode 2, materials, such as metals including gold, platinum, chromium, palladium, aluminum, indium, molybdenum, low-resistance polysilicon, and low-resistance amorphous silicon, tin oxide, indium oxide, and indium tin oxide (ITO), can be used. One of these materials can be used alone, or two or more of these materials can be used in combination. Such gate electrode 2 can be formed using a method, for example, vapor deposition, sputtering, plating, or CVD. The thickness of such gate electrode 2 is preferably 0.05 to 100 μm. An n-type silicon substrate doped at high concentration can also be used as the gate electrode 2. The n-type silicon substrate doped at high concentration has the properties of the gate electrode and also the properties of the substrate. When the gate electrode 2 also having the properties of the substrate in this manner is used, it is also possible to eliminate the substrate 1 in the first embodiment and the second embodiment of the present invention.

(Gate Insulating Layer)

As the gate insulating layer 3, an insulating film of an inorganic insulator or an organic insulator can be used. Specific examples of the inorganic insulator include silicon oxide, silicon nitride, aluminum oxide, aluminum nitride, and titanium oxide. Specific examples of the organic insulator include polyethylene, polyester, polyimide, polyphenylene sulfide, organic glass, polyvinyl alcohol, polyvinyl phenol, polyparaxylene, and polyacrylonitrile. One of these inorganic insulators and organic insulators can be used alone, or two or more of these inorganic insulators and organic insulators can be used in combination.

Such gate insulating layer 3 can be formed by, for example, CVD, plasma CVD, plasma polymerization, vapor deposition, spin coating, dipping, nozzle coating, capillary coating, cluster ion beam vapor deposition, and LB. The thickness of such gate insulating layer 3 is preferably 50 to 1000 nm. When an n-type silicon substrate doped at high concentration is used as the gate electrode 2, a film of silicon oxide can be formed by thermally oxidizing a surface of the n-type silicon substrate, and this film can also be used as the gate insulating layer 3.

(Semiconductor Layer)

The semiconductor layer 4 in the organic field effect transistor of the present invention contains a polymer compound having an ionization potential of 5.0 eV or more. According to this, the on-state current and the current on/off ratio in such an organic field effect transistor are improved, and the decrease in current on/off ratio is sufficiently small even when the organic field effect transistor is exposed to the air.

The ionization potential of the polymer compound is preferably 5.0 to 6.2 eV, more preferably 5.2 to 6.0 eV, and further preferably 5.4 to 5.9 eV. If the ionization potential is less than 5.0 eV, the semiconductor layer 4 is doped with oxygen, in the air, so the off-state current increases, and the current on/off ratio in the air, in such an organic field effect transistor, decreases. If the ionization potential is more than 6.2 eV, there is a tendency that the on-state current decreases, and the current on/off ratio in such an organic field effect transistor decreases, compared with the case where the ionization potential is in the above range.

Examples of the polymer compound having an ionization potential of 5.0 eV or more include a polymer compound having a fluorene skeleton, a polymer compound having a benzene ring skeleton, a polymer compound having a naphthalene ring skeleton, and a polymer compound having a carbazole skeleton. Each of these polymer compounds may be any of a random copolymer, a block copolymer, and a graft copolymer, and may be a polymer having a structure intermediate between them, for example, a random copolymer having a block property. Among these, a block copolymer, a graft copolymer, and a random copolymer having blockiness are preferred in terms of obtaining an organic field effect transistor having excellent characteristics. These polymer compounds also include one having a branched main chain and having three or more copolymer ends. Such a polymer compound may form the semiconductor layer 4 alone, or may form the semiconductor layer 4 with another component. The content of another component when it is contained is preferably less than 10% by mass with respect to the entire semiconductor layer.

The above polymer compound preferably has a fluorene skeleton. Further, the fluorene skeleton is preferably one represented by the following general formula (2), (3), or (4).

[Formula 2]

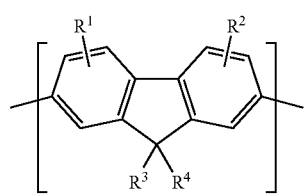

(2)

[Formula 3]

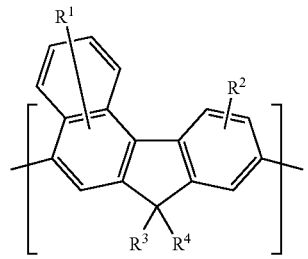

(3)

[Formula 4]

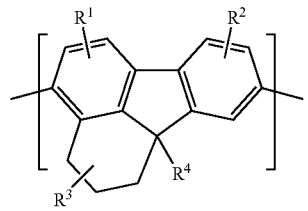

(4)

Here, in the above formulas (2), (3), and (4), $R^1$, $R^2$, $R^3$, and $R^4$ each independently represent a hydrogen atom, an alkynyl group, an alkenyl group, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, a monovalent heterocyclic group, or a cyano group. $R^1$, $R^2$, $R^3$, and $R^4$ may be bonded to each other to form a ring.

Further, in the above formulas (2), (3), and (4), at least one of $R^1$, $R^2$, $R^3$, and $R^4$ is preferably a group other than a hydrogen atom, in terms of improving solubility in the organic solvent. Specific examples of the fluorene skeleton represented by the above general formula (2), (3), or (4) having such $R^1$, $R^2$, $R^3$, and $R^4$ include fluorene skeletons represented by the following formulas (A) to (H).

[Formula 5]

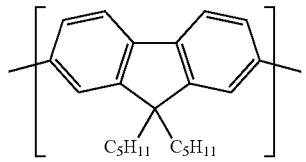

(A)

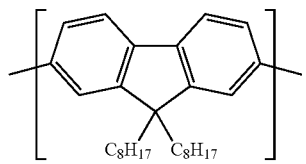

(B)

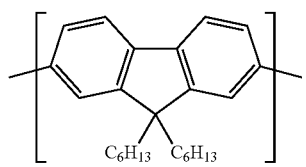

(C)

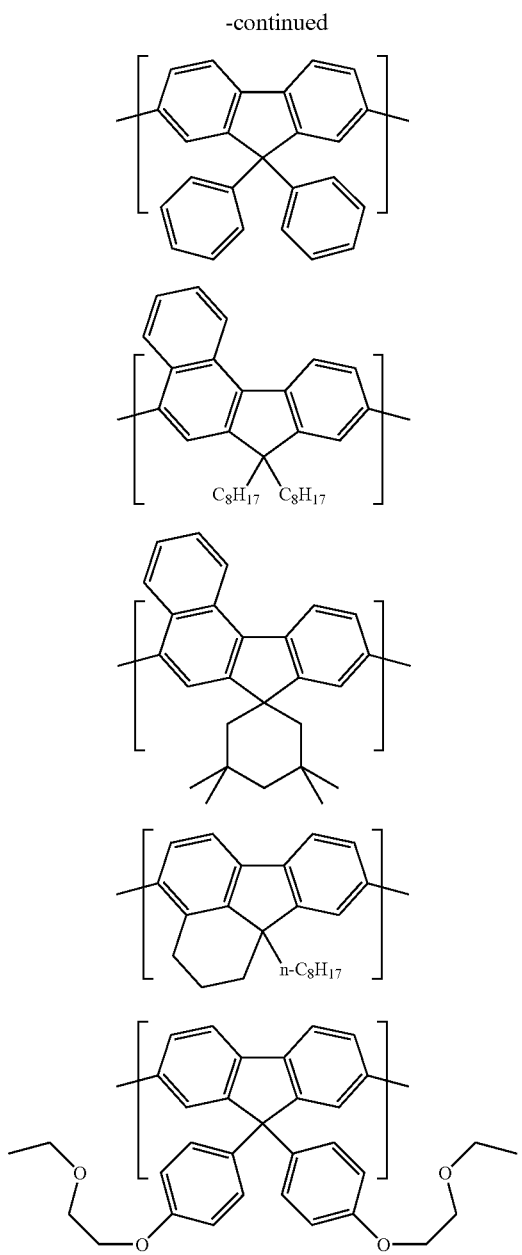

As the above-described polymer compound having a fluorene skeleton, conventionally known one can be used, and the above-described polymer compound having a fluorene skeleton can also be synthesized by conventionally known polymerization reaction. As the monomer used in polymerization reaction, conventionally known one can be used. One example of the monomer and polymerization reaction is shown below.

9,9-disubstituted-2,7-fluorene diboronate, one example of the monomer used in polymerization reaction, can be synthesized by, for example, the following method. A hexane solution of n-butyllithium is dropped into a tetrahydrofuran solution of known 9,9-disubstituted-2,7-dibromofluorene stirred at −78° C., under a nitrogen atmosphere. Triisopropyl borate is added to the obtained suspension, which is then stirred and further poured into ice water containing concentrated hydrochloric acid, which is then stirred. After stirring, the material is extracted with diethyl ether. The obtained extract is washed with a saturated saline solution and then dried to obtain crude diboronic acid. The obtained crude diboronic acid is suspended in toluene and ethylene glycol, and the suspension is refluxed while being stirred. The residue is recrystallized using hexane to obtain 9,9-disubstituted-2,7-fluorene diboronate.

The thus obtained 9,9-disubstituted-2,7-fluorene diboronate is polymerized with a dibromo compound to obtain the above-described polymer compound having a fluorene skeleton. In this polymerization, one dibromo compound can be used alone, or two or more dibromo compounds can be used in combination. In addition to 9,9-disubstituted-2,7-fluorene diboronate, a diboronate compound may be further added and copolymerized. The above-described polymer compound having a fluorene skeleton is obtained also by polymerizing 9,9-disubstituted-2,7-dibromofluorene with a diboronate compound or a dibromo compound.

The dibromo compound includes, for example, compounds represented by the following formulas (I) to (VI), and 9,9-disubstituted-2,7-dibromofluorene. The diboronate compound includes, for example, compounds in which the bromo group in the compounds represented by the following formulas (I) to (VI) is substituted with boronate, and 9,9-disubstituted-2,7-fluorene diboronate. In the formulas (IV) to (VI), R represents a hydrogen atom, an alkyl group, an alkoxy group, or an aryl group, and p represents an integer of 1 to 5.

[Formula 6]

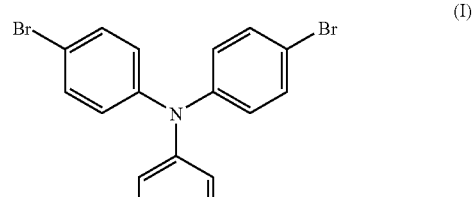

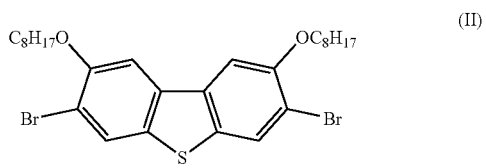

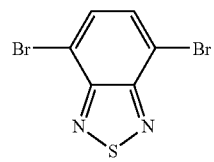

[Formula 7]

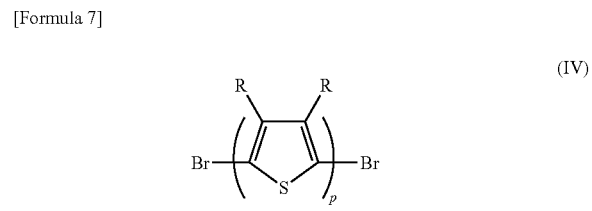

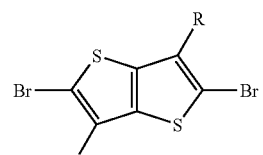

(V)

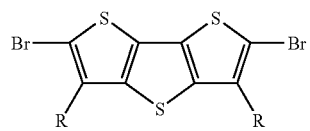

(VI)

Examples of methods for polymerizing these monomers include a reaction using a nickel catalyst, such as Yamamoto coupling, and a reaction using a palladium catalyst, such as Suzuki coupling. If the purity of the polymer compound is low, the characteristics of the organic field effect transistor may decrease. Therefore, after polymerization, the obtained polymer compound is preferably purified by reprecipitation purification, fractionation by chromatography, or the like.

In the above-described polymerization, 10% or more by mass of the monomer having a fluorene skeleton (for example, 9,9-disubstituted-2,7-fluorene diboronate and 9,9-disubstituted-2,7-dibromofluorene) is preferably used with respect to the total amount of monomers used in polymerization. If the monomer having a fluorene skeleton is less than 10% by mass, the current on/off ratio in the obtained organic field effect transistor tends to decrease. Similarly, in the above polymerization, more preferably 10% or more by mass, further preferably 30% or more by mass of the monomer having a fluorene skeleton is preferably used with respect to the total amount of the monomers used in polymerization, in terms of improving the current on/off ratio in the organic field effect transistor.

Examples of the polymer compound having a fluorene skeleton obtained by the above-described method include polymer compounds represented by the following formulas (a) to (n). In the formulas, a numerical value represents the ionization potential (unit: eV) of the polymer compound, and Mw represents weight-average molecular weight in terms of polystyrene. The ionization potential described in Examples was measured as follows. A 0.8 wt % toluene solution of each polymer compound was prepared and applied to a quartz substrate to fabricate a thin film. Ionization potential was measured for this thin film, using AC2 manufactured by Riken Keiki Co., Ltd.

[Formula 8]

(a)

5.99 eV, Mw = 380000

(b)

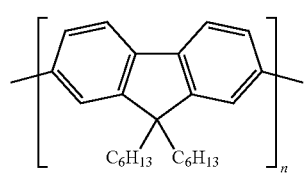

5.74 eV, Mw = 16000

(c)

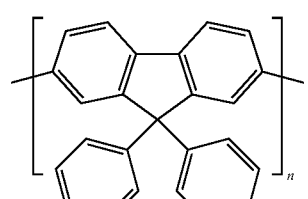

5.92 eV, Mw = 10000

(d)

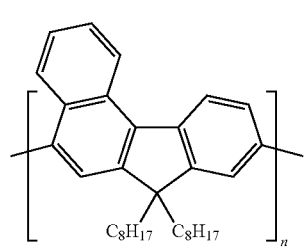

5.88 eV, Mw = 78000

(e)

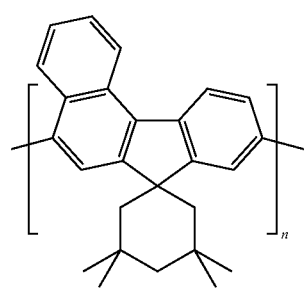

5.68 eV, Mw = 500000

(f)

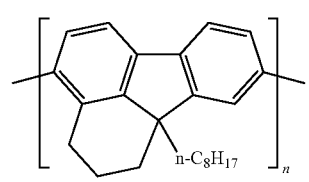

5.80 eV, Mw = 610000

(g)

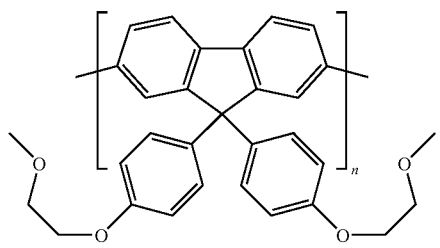

5.67 eV, Mw = 730000

[Formula 9]

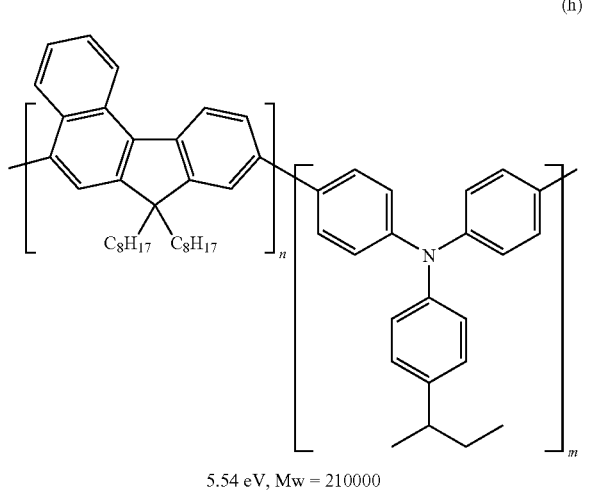

5.54 eV, Mw = 210000

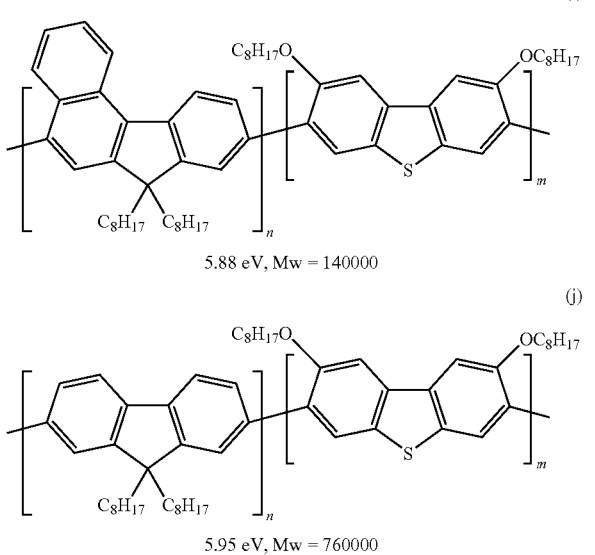

5.88 eV, Mw = 140000

5.95 eV, Mw = 760000

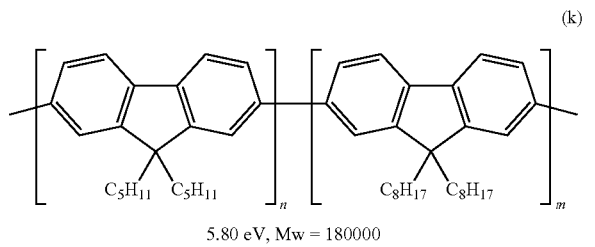

5.80 eV, Mw = 180000

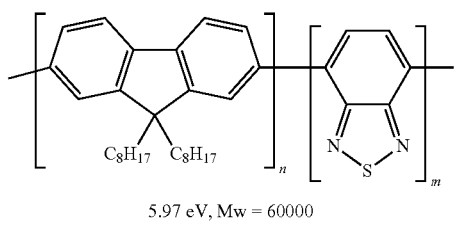

5.97 eV, Mw = 60000

[Formula 10]

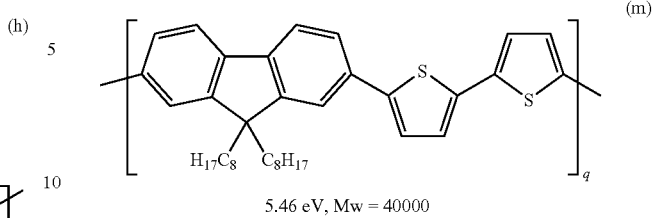

5.46 eV, Mw = 40000

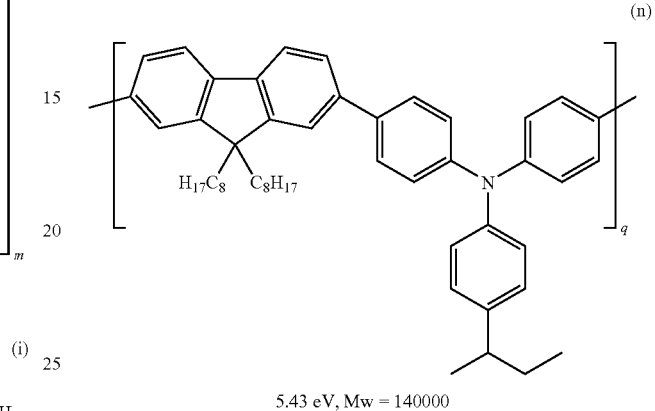

5.43 eV, Mw = 140000

Here, the ratio of n to m (n:m) in the above formulas (h), (i), (j), (k), and (l) is 8:2, 5:5, 5:5, 2:8, and 7:3, respectively. The polymer compounds represented by the formulas (h), (i), (j), (k), and (l) are random copolymers. The polymer compounds represented by the formulas (m) and (n) are alternating copolymers. In the formulas (m) and (n), q represents the degree of polymerization.

The above-described polymer compound preferably has a weight-average molecular weight, in terms of polystyrene, of $1 \times 10^3$ to $1 \times 10^8$, more preferably $5 \times 10^3$ to $1 \times 10^7$. If the weight-average molecular weight is less than $1 \times 10^3$, a homogeneous semiconductor layer is not obtained, and the current on/off ratio tends to decrease, compared with the case where the weight average molecular weight is in the above range. If the weight average molecular weight is more than $1 \times 10^8$, the film formation properties of the semiconductor layer tend to decrease. The thickness of the above-described semiconductor layer 4 is preferably 50 to 1000 nm.

(Source Electrode and Drain Electrode)

The source electrode 7 has the compound layer 5 and the conductive layer 6, and the drain electrode 8 has the compound layer 5' and the conductive layer 6'.

The compound layers 5 and 5' are layers containing a compound different from that of the above-described semiconductor layer 4 and the conductive layer 6 described later. These compound layers 5 and 5' comprise an acceptor compound. Specific examples of the acceptor compound include tetracyanoquinodimethane, tetracyanonaphthoquinodimethane, benzoquinone, naphthoquinone, anthraquinone, dicyanoquinodiimine, fluorene, fluorenone, trinitrofluorene, tetranitrofluorene, and tetracyanoethylene, and derivatives thereof. Tetracyanoquinodimethane (TCNQ) and tetracyanotetrafluoroquinodimethane ($F_4$TCNQ) are particularly preferred. One of these compounds can be used alone, or two or more of these compounds can be used in combination.

The above acceptor compound is also preferably a fullerene derivative. The "fullerene derivative" refers to a compound having a fullerene skeleton in the molecule. Specific examples thereof include fullerene $C_{60}$, fullerene $C_{70}$, fullerene $C_{76}$, fullerene $C_{78}$, and fullerene $C_{84}$, and those part of which is substituted. One of these fullerene derivatives can be used alone, or two or more of these fullerene derivatives can be used in combination. These fullerene derivatives can also be used in combination with the above-described acceptor compounds other than fullerene derivatives.

The thickness of the above-described compound layers 5 and 5' is preferably 1 to 200 nm.

The conductive layers 6 and 6' are preferably composed of a low-resistance material. For example, gold, platinum, chromium, palladium, aluminum, indium, molybdenum, and the like can be used as the material of the conductive layers 6 and 6'. One of these materials can be used alone, or two or more of these materials can be used in combination. The thickness of such conductive layers 6 and 6' is preferably 0.05 to 1000 μm.

The compound layer 5 and the compound layer 5' may be formed of the same material or materials different from each other. Similarly, the conductive layer 6 and the conductive layer 6' may be formed of the same material or materials different from each other.

The above-described organic field effect transistor can be manufactured by a conventionally known method, except that the compound layer is formed between the conductive layer and the semiconductor layer, and that the compound layer contains a polymer compound having an ionization potential of 5.0 eV or more. For example, the above-described organic field effect transistor can be manufactured by the following method.

First, the gate electrode 2 is formed on the substrate 1, using, for example, vapor deposition. Then, the gate insulating layer 3 is formed on the formed gate electrode 2 by vapor deposition. Further, the semiconductor layer 4 is formed. The semiconductor layer 4 can be formed by applying a solution of the above-described polymer compound dissolved in an organic solvent, onto the gate insulating layer 3. Subsequently, the compound layers 5 and 5' and the conductive layers 6 and 6' are each formed by, for example, vapor deposition, to obtain the above-described organic field effect transistor.

Examples of the organic solvent in forming the semiconductor layer 4 include chloroform, methylene chloride, dichloroethane, tetrahydrofuran, toluene, xylene, mesitylene, decalin, and n-butylbenzene. For application in forming the semiconductor layer 4, a method such as spin coating, casting, microgravure coating, gravure coating, bar coating, roll coating, wire bar coating, dip coating, nozzle coating, capillary coating, spray coating, screen printing, flexographic printing, offset printing, and inkjet printing can be used. After the semiconductor layer 4 is formed, heat treatment may be further applied.

Examples

The present invention will be described below in more detail by Examples, but the present invention is not limited thereto. In the following Examples, "$F_4TCNQ$" represents tetracyanotetrafluoroquinodimethane (manufactured by Tokyo Chemical Industry Co., Ltd.), and "P3HT" represents poly-3-hexylthiophene (manufactured by Aldrich, ionization potential=4.69 eV). The ionization potential described in the Examples was measured as follows. A 0.8 wt % toluene solution of each polymer compound was prepared and applied to a quartz substrate to fabricate a thin film. Ionization potential was measured for this thin film, using AC2 manufactured by Riken Keiki Co., Ltd.

Synthesis Example 1

2,7-dibromo-9,9-dioctylfluorene (26 g, 0.047 mol), 2,7-dibromo-9,9-diisopentylfluorene (5.6 g, 0.012 mol), and 2,2'-bipyridyl (22 g, 0.141 mol) were dissolved in 1600 mL of dehydrated tetrahydrofuran, and then, nitrogen bubbling was performed for nitrogen substitution in the system. Under a nitrogen atmosphere, bis(1,5-cyclooctadiene)nickel(0)[Ni(COD)$_2$] (40 g, 0.15 mol) was added to this solution, the temperature of the solution was increased to 60° C., and the solution was reacted for 8 hours. After reaction, this reaction solution was cooled to room temperature (about 25° C.) and dropped into a mixed solution of 200 mL of 25 wt % aqueous ammonia/1200 mL of methanol/1200 mL of ion exchange water. The solution was stirred for 30 minutes, and then, the deposited precipitation was filtered and air-dried. Subsequently, the precipitation was dissolved in 1100 mL of toluene, and then, filtration was performed. The filtrate was dropped into 3300 mL of methanol, which was then stirred for 30 minutes. The deposited precipitation was filtered, washed with 1000 mL of methanol, and then dried under reduced pressure for 5 hours. The obtained copolymer was a (2,7-9,9-di-n-octylfluorenediyl)(2,7-9,9-diisoamylfluorenediyl) copolymer (polymer compound 1), and the yield was 20 g. The polymer compound 1 had a weight average molecular weight, in terms of polystyrene, of Mw=$1.8 \times 10^5$ and an ionization potential of 5.80 eV.

Synthesis Example 2

2,7-dibromo-9,9-di-n-octylfluorene and 5,5'-dibromo-2,2'-bithiophene were used, and these monomers were reacted in the presence of a palladium catalyst by a method described in U.S. Pat. No. 5,777,070 to synthesize a (2,7-9,9-di-n-octylfluorenediyl)(5,5'-dibromo-2,2'-bithiophene) alternating copolymer (polymer compound 2). The polymer compound 2 had a weight average molecular weight, in terms of polystyrene, of Mw=$4 \times 10^4$ and an ionization potential of 5.46 eV.

Synthesis Example 3

2,7-dibromo-9,9-di-n-octylfluorene and N,N-di(4-bromophenyl)-4-sec butylphenylamine were used, and these monomers were reacted in the presence of a palladium catalyst by the method described in U.S. Pat. No. 5,777,070 to synthesize a (2,7-9,9-di-n-octylfluorenediyl)(1,4-phenylene-((4-sec butylphenyl)imino)-1',4'-phenylene) alternating copolymer (polymer compound 3). The polymer compound 3 had a weight average molecular weight, in terms of polystyrene, of Mw=$4 \times 10^4$ and an ionization potential of 5.43 eV.

Example 1

A 200 nm silicon oxide film formed on a 280 μm thick n-type silicon substrate doped at high concentration and having a surface thereof treated by thermal oxidation was ultrasonically washed with acetone for 10 minutes. The washed silicon substrate was immersed in a solution of octadecyltrichlorosilane (OTS, manufactured by Shin-Etsu Chemical Co., Ltd.) diluted to 20 mmol/L with octane, in nitrogen for 12 hours. Subsequently, the silicon substrate was washed with chloroform to provide a surface-treated substrate.

A 0.5 wt % chloroform solution of the polymer compound 1 obtained in Synthesis Example 1 was prepared, and the surface-treated silicon substrate was spin coated with this solution at 1000 rpm for 60 seconds to form a 100 nm thick semiconductor layer. Subsequently, a 5 nm thick $F_4TCNQ$ was vapor deposited, and a 50 nm thick gold (Au) was further vapor deposited to form a source electrode and a drain electrode to obtain an organic field effect transistor in Example 1.

The source electrode and the drain electrode at this time had a channel width of 2 mm and a channel length of 20 μm. In the above-described operations, vapor deposition was performed under vacuum, and operations other than vapor deposition were all performed under a nitrogen atmosphere.

Example 2

An organic field effect transistor in Example 2 was obtained as in Example 1, except that fullerene $C_{60}$ was used instead of $F_4TCNQ$.

Example 3

An organic field effect transistor in Example 3 was obtained as in Example 1, except that the polymer compound 2 was used instead of the polymer compound 1.

Example 4

An organic field effect transistor in Example 4 was obtained as in Example 1, except that the polymer compound 2 was used instead of the polymer compound 1, and that TCNQ was used instead of $F_4TCNQ$.

Example 5

An organic field effect transistor in Example 5 was obtained as in Example 1, except that the polymer compound 2 was used instead of the polymer compound 1, and that fullerene $C_{60}$ was used instead of $F_4TCNQ$.

Example 6

An organic field effect transistor in Example 6 was obtained as in Example 1, except that the polymer compound 3 was used instead of the polymer compound 1.

Example 7

An organic field effect transistor in Example 5 was obtained as in Example 1, except that the polymer compound 3 was used instead of the polymer compound 1, and that fullerene $C_{60}$ was used instead of $F_4TCNQ$.

Comparative Example 1

A 200 nm silicon oxide film formed on a 280 μm thick n-type silicon substrate doped at high concentration and having a surface thereof treated by thermal oxidation was ultrasonically washed with acetone for 10 minutes. The washed silicon substrate was immersed in a solution of octadecyltrichlorosilane (OTS, manufactured by Shin-Etsu Chemical Co., Ltd.) diluted to 20 mmol/L with octane, in nitrogen for 12 hours. Subsequently, the silicon substrate was washed with chloroform to provide a surface-treated substrate.

A 0.5 wt % chloroform solution of P3HT was prepared, and the surface-treated silicon substrate was spin coated with this solution at 1000 rpm for 60 seconds to form a 100 nm thick semiconductor layer. Subsequently, a 50 nm thick gold was vapor deposited to form a source electrode and a drain electrode to obtain an organic field effect transistor in Comparative Example 1. The source electrode and the drain electrode at this time had a channel width of 2 mm and a channel length of 20 μm. In the above-described operations, vapor deposition was performed under vacuum, and operations other than vapor deposition were all performed under a nitrogen atmosphere.

Comparative Example 2

An organic field effect transistor in Comparative Example 2 was obtained as in Example 1, except that P3HT was used instead of the polymer compound 1, and that TCNQ was used instead of $F_4TCNQ$.

Comparative Example 3

An organic field effect transistor in Comparative Example 3 was obtained as in Example 1, except that P3HT was used instead of the polymer compound 1, and that fullerene $C_{60}$ was used instead of $F_4TCNQ$.

Comparative Example 4

An organic field effect transistor in Comparative Example 4 was obtained as in Comparative Example 1, except that the polymer compound 1 was used instead of P3HT.

(Evaluation of Organic Field Effect Transistor)

For the organic field effect transistors obtained in Examples 1 to 7 and Comparative Examples 1 to 4, the current value was measured, with the gate voltage Vg changed from 0 to −60 V, and the source-drain voltage Vsd changed from 0 to −60 V, in a vacuum. These measurements were all performed in a vacuum. The on-state current obtained at Vg=−60 V, and the ratio of the on-state current obtained at Vg=−60 V to the off-state current obtained at Vg=+5 V (on/off ratio), at Vsd=−60 V, are shown in Table 1. Further, the current value of the organic field effect transistors obtained in the Examples and the Comparative Examples was measured similarly to the above-described method, except that measurement was performed in the air. The ratio of the on-state current obtained at Vg=−60 V to the off-state current obtained at Vg=+5 V is shown in Table 1.

TABLE 1

| | Semiconductor layer | Compound layer | On-state current in vacuum | Current on/off ratio in vacuum | Current on/off ratio in air |
|---|---|---|---|---|---|
| Example 1 | Polymer compound 1 | $F_4TCNQ$ | $1 \times 10^{-6}$ | $2 \times 10^6$ | $8 \times 10^5$ |
| Example 2 | Polymer compound 1 | Fullerene $C_{60}$ | $2 \times 10^{-6}$ | $3 \times 10^6$ | $1 \times 10^6$ |
| Example 3 | Polymer compound 2 | $F_4TCNQ$ | $1 \times 10^{-5}$ | $1 \times 10^6$ | $3 \times 10^5$ |
| Example 4 | Polymer compound 2 | TCNQ | $7 \times 10^{-6}$ | $7 \times 10^5$ | $1 \times 10^5$ |
| Example 5 | Polymer compound 2 | Fullerene $C_{60}$ | $8 \times 10^{-6}$ | $4 \times 10^6$ | $1 \times 10^6$ |
| Example 6 | Polymer compound 3 | $F_4TCNQ$ | $6 \times 10^{-6}$ | $3 \times 10^6$ | $1 \times 10^6$ |
| Example 7 | Polymer compound 3 | Fullerene $C_{60}$ | $7 \times 10^{-7}$ | $7 \times 10^5$ | $1 \times 10^5$ |
| Comparative Example 1 | P3HT | — | $2 \times 10^{-6}$ | $1 \times 10^3$ | $4 \times 10^1$ |
| Comparative Example 2 | P3HT | TCNQ | $8 \times 10^{-5}$ | $3 \times 10^2$ | $2 \times 10^1$ |
| Comparative Example 3 | P3HT | Fullerene $C_{60}$ | $8 \times 10^{-6}$ | $5 \times 10^3$ | $2 \times 10^3$ |
| Comparative Example 4 | Polymer compound 1 | — | $1 \times 10^{-8}$ | $2 \times 10^3$ | $3 \times 10^2$ |

The invention claimed is:

1. An organic field effect transistor comprising a gate electrode, a gate insulating layer, a semiconductor layer, a source electrode, and a drain electrode,
   wherein the source electrode and the drain electrode are each composed of a conductive layer and a compound layer comprising an acceptor compound,
   wherein the compound layers are each located in contact with the semiconductor layer, and
   wherein the semiconductor layer contains a polymer compound having an ionization potential of 5.0 eV or more.

2. The organic field effect transistor according to claim 1, wherein the polymer compound has a fluorene skeleton.

3. The organic field effect transistor according to claim 1, wherein the acceptor compound is tetracyanoquinodimethane and/or tetracyanotetrafluoroquinodimethane.

4. The organic field effect transistor according to claim 1, wherein the acceptor compound is a fullerene derivative.

* * * * *